United States Patent
Holmes

(10) Patent No.: US 7,102,452 B1
(45) Date of Patent: Sep. 5, 2006

(54) TEMPERATURE-COMPENSATED RC OSCILLATOR

(75) Inventor: Steven L. Holmes, Sammamish, WA (US)

(73) Assignee: ZiLOG, Inc., San Jose, CA (US)

( * ) Notice: Subject to any disclaimer, the term of this patent is extended or adjusted under 35 U.S.C. 154(b) by 134 days.

(21) Appl. No.: 11/026,750

(22) Filed: Dec. 31, 2004

(51) Int. Cl.
*H03K 3/26* (2006.01)

(52) U.S. Cl. .................. 331/111; 331/143; 331/176; 331/175

(58) Field of Classification Search ............. 331/111, 331/143, 176, 175
See application file for complete search history.

(56) References Cited

U.S. PATENT DOCUMENTS

| | | | |
|---|---|---|---|
| 4,423,370 A | 12/1983 | Wilhelm | 323/315 |
| 4,786,825 A | 11/1988 | Califano | 327/206 |
| 4,893,095 A | 1/1990 | Thommen | 331/57 |
| 4,963,840 A * | 10/1990 | Thommen | 331/111 |
| 5,565,819 A | 10/1996 | Cooper | 331/111 |
| 5,793,260 A | 8/1998 | Fawal et al. | 331/111 |
| 5,811,993 A | 9/1998 | Dennard et al. | 327/54 |
| 5,889,441 A | 3/1999 | Inn | 331/143 |
| 6,239,585 B1 | 5/2001 | Buono | 323/282 |
| 6,496,075 B1 | 12/2002 | Justice et al. | 331/11 |
| 6,680,656 B1 * | 1/2004 | Chen | 331/143 |
| 7,053,724 B1 * | 5/2006 | Rusu et al. | 331/143 |

OTHER PUBLICATIONS

Vilas Boas, A. and Olmos, A., "A temperature compensated digitally trimmable on-chip IC oscillator with low voltage inhibit capability", IEEE Journal of Circuits and Systems, 2004, ISCAS 2004, Proceedings of the 2004 International Symposium, vol. 1, May 23-26, 2004, pp. I-501-I-504.

Shakiba, M.H.; Sowlati, T., "Automatic swing control in relaxation oscillators", IEEE Journal of Solid-State Circuits, vol. 33, Issue 12, Dec. 1998, pp. 1979-1986.

* cited by examiner

Primary Examiner—Arnold Kinkead
(74) Attorney, Agent, or Firm—Silicon Edge Law Group LLP; Darien K. Wallace

(57) ABSTRACT

An on-chip oscillator generates a substantially temperature-independent clock signal by compensating for temperature-induced changes in its RC time constant and in a range between trigger voltages. A resistor with a positive temperature coefficient determines the range between trigger voltages, which increases with increasing temperature. A comparator response time is part of a delay period that occurs after a trigger voltage is passed and before the charging or discharging of a capacitor is reversed. After the delay period, a remainder period elapses before the other trigger voltage is passed. As temperature increases, the oscillator increases current supplied to a comparator to decrease the response time. Moreover, as temperature increases, the oscillator increases a charge/discharge current so that the capacitor charges and discharges faster as the range between trigger voltages increases. The delay period and the remainder period are adjusted so that their sum remains substantially constant over a large temperature range.

20 Claims, 8 Drawing Sheets

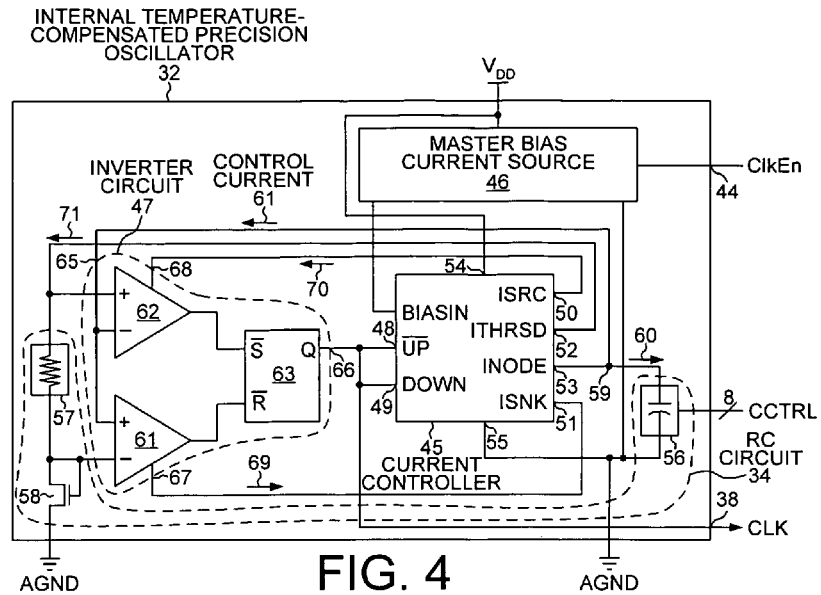
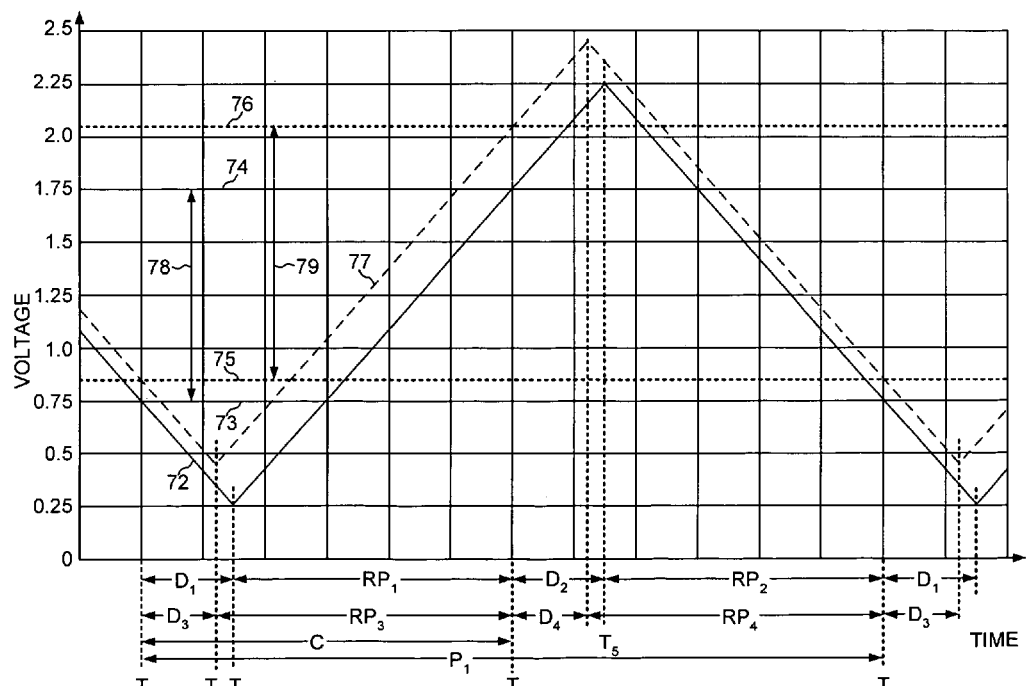
FIG. 4
FIG. 5

TEMPERATURE-COMPENSATED RC OSCILLATOR

TECHNICAL FIELD

The present invention relates generally to clock circuits and, more specifically, to an on-chip, precision RC oscillator that controls a bias current to compensate for temperature variation of the oscillation.

BACKGROUND

Microcontrollers are found in wide variety of products, such as electronic consumer devices, household appliances and even cars. A product can best be controlled by a microcontroller that is clocked by a stable and accurate oscillating signal. One method of generating a stable and accurate clock signal is to use a phase-locked loop (PLL) that receives an accurate reference signal from an external crystal oscillator. Manufacturing costs can be reduced, however, by generating the clock signal using an internal, on-chip oscillator as opposed to a more expensive external crystal oscillator.

An internal precision oscillator in a microcontroller can be an RC oscillator. A capacitor of the RC circuit is charged and discharged after the voltage across the capacitor reaches a lower and upper trigger voltage, respectively. The rate at which the capacitor is charged and discharged depends on the RC time constant of the RC circuit. The output frequency can be tuned by controlling either the capacitance of the capacitor and/or the resistance of the resistor in the RC circuit.

In some applications, a microcontroller experiences a wide variation in its operating temperature. Temperature variation can affect the frequency of the clock signal output by the RC oscillator, and that clock signal may become insufficiently stable and accurate for the particular application. For example, the RC oscillator may contain a resistor whose resistance changes with temperature, i.e., the resistor has a positive or negative temperature coefficient. A change in resistance may effect not only the RC time constant, but also the trigger voltages at which the capacitor is charged and discharged.

FIG. 1 (prior art) shows a conventional RC oscillator 10 with an RC circuit 11. Oscillator 10 has an RS latch 12 for switching between the output of two comparators. An RC node 13 is coupled to a inverting input lead 14 of a discharge comparator 15 and to a non-inverting input lead 16 of a charge comparator 17. Charge comparator 17 detects when the voltage on RC node 13 reaches a lower reference voltage, at which time RS latch 12 causes charge to accumulate on RC node 13. Discharge comparator 15 detects when the voltage on RC node 13 reaches a higher reference voltage, at which time RS latch 12 causes charge to discharge from RC node 13. The reference voltages are generated by a voltage divider 18 formed by a resistor string. As the operating temperature of oscillator 10 changes, the resistances of the resistors in the resistor string change, thereby changing the reference voltages.

FIG. 2 (prior art) is a waveform diagram illustrating the change in frequency of the clock signal output by oscillator 10 as a result of a change of the reference voltages caused by a temperature variation. Oscillator 10 outputs a clock signal 19 at a lower temperature and a slower clock signal 20 at a higher temperature. In this example, as the temperature increases, the resistance of each resistor in voltage divider 18 increases. The increased resistance causes a lower reference voltage 21 to increase and an upper reference voltage 22 to increase by an even greater absolute amount. Lower reference voltage 21 increases from 1V to 1.2V. Upper reference voltage 22 increases from 3V to 3.6V. Thus, a range 23 between reference voltages is 2V at a lower temperature. At a higher temperature, oscillator 10 exhibits a range 24 of 2.4V between reference voltages. Where the RC time constant does not change with temperature, the period 25 required to charge and discharge RC node 13 over range 24 of 2.4V is longer than the period 26 required to charge and discharge RC node 13 over range 23 of 2V. The frequency the clock signal output by oscillator 10, therefore, decreases as temperature increases. Moreover, where the resistance of the resistor in RC circuit 31 increases with increasing temperature, the RC time constant also increases, which slows the frequency of the clock signal even more.

One method of compensating for resistance changes caused by temperature variation in RC oscillators relies on matching resistors with positive temperature coefficients to resistors having negative temperature coefficients. U.S. Pat. No. 5,889,441, which is herein incorporated by reference, describes an RC oscillator whose output frequency is substantially independent of temperature variation because the RC oscillator uses matched resistor pairs whose combined resistance is substantially temperature independent. It can be difficult, however, to manufacture an on-chip resistor whose temperature coefficient inversely matches that of its paired resistor over the entire operating temperature range of a microcontroller.

Another method for compensating for temperature variations uses a separate regulator circuit that generates precise reference voltages. The regulator circuit generates temperature independent reference voltages that are used by the comparators as trigger voltages. Especially where the RC oscillator is on the microcontroller chip, however, the regulator circuit occupies valuable space.

A method is sought for generating a clock signal from an RC oscillator that is substantially temperature independent and that does not require matched resistor pairs or a reference voltage regulator circuit.

SUMMARY

An internal, on-chip temperature-compensated precision oscillator generates a clock signal whose frequency remains substantially stable over a large range of operating temperatures. The oscillator is fully integrated on a semiconductor substrate and does not require external components. The temperature-compensated oscillator compensates for temperature-induced changes in an RC circuit and in a range between two trigger voltages. The range between trigger voltages increases with increasing temperature because it is established using a resistor with a positive temperature coefficient. A delay period occurs after a trigger voltage is passed and before the charging or discharging of a capacitor charge node is reversed. The response time of a comparator is part of the delay period. Following the delay period, a remainder period elapses until the voltage on the capacitor charge node passes the other trigger voltage.

As temperature increases, the temperature-compensated oscillator increases the source current supplied to the comparator in order to decrease the response time. In addition, as temperature increases, the temperature-compensated oscillator increases a charge/discharge current supplied to the capacitor charge node so that the capacitor charges and discharges faster as the range between trigger voltages increases. The temperature-compensated oscillator adjusts the source current to the comparator and the charge/discharge current to the capacitor charge node so that the sum of the delay period and the remainder period remains substantially constant over a large range of operating temperatures of the temperature-compensated oscillator.

In another embodiment, the temperature-compensated oscillator adjusts the source current to the comparator and not the charge/discharge current so that the delay period is decreased to compensate for any increase in the remainder period as temperature increases. In yet another embodiment, the temperature-compensated oscillator adjusts only the charge/discharge current so that the capacitor charge node charges and discharges faster to compensate for any increase in the range between trigger voltages as temperature increases.

A method detects a start time when the voltage on the charge node reaches a first trigger voltage. A delay period begins at the start time, ends at an end time, and depends on a comparator source current. The method inverts a digital signal at the end time and then detects when the voltage on the charge node reaches a second trigger voltage. A remainder period begins at the end time and ends when the voltage on the charge node reaches the second trigger voltage. The second trigger voltage is a first voltage at a first temperature and a second voltage at a second temperature. The method adjusts the comparator source current such that the sum of the delay period and the remainder period is substantially constant at the first temperature and at the second temperature.

Other embodiments and advantages are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 4 is a more detailed schematic diagram of the internal temperature-compensated precision oscillator shown in FIG. 3.

FIG. 5 is a waveform diagram illustrating that the output frequency of the internal temperature-compensated precision oscillator of FIG. 3 is substantially temperature independent.

DETAILED DESCRIPTION

Reference will now be made in detail to some embodiments of the invention, examples of which are illustrated in the accompanying drawings.

Figure 1:
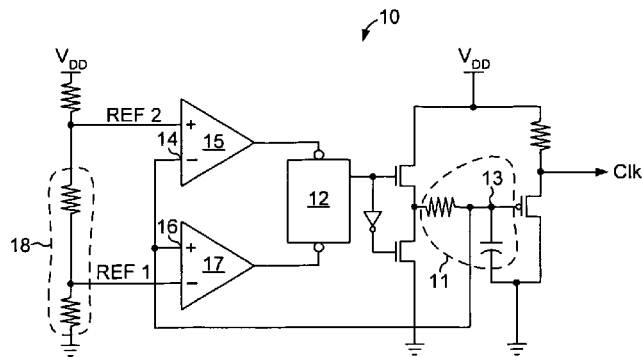
FIG. 1 (prior art) is a simplified schematic diagram of a conventional RC oscillator.
Figure 2:
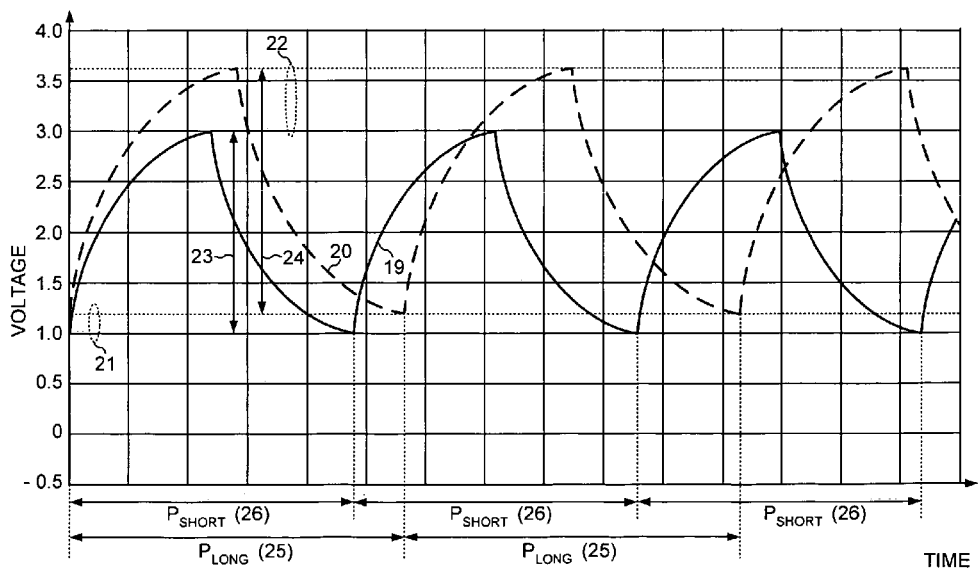
FIG. 2 (prior art) is a waveform diagram illustrating the temperature dependence of the output frequency of the RC oscillator of FIG. 1.
Figure 3:
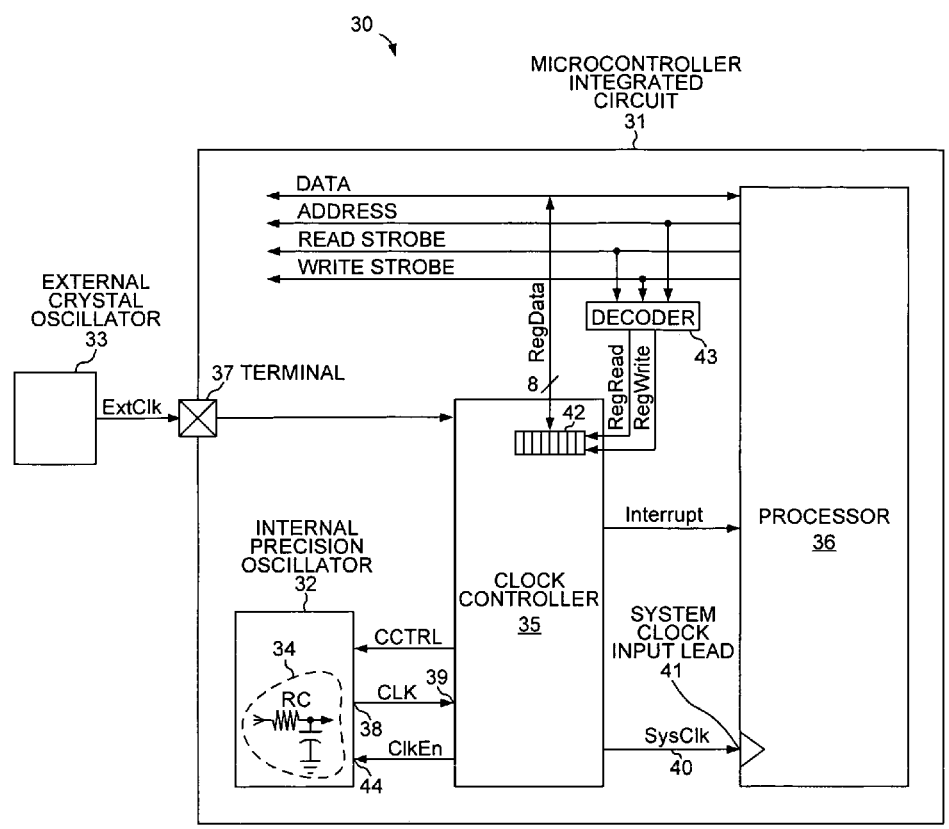
FIG. 3 is a simplified schematic diagram of a microcontroller system that includes an internal temperature-compensated precision oscillator.

FIG. 3 is a system-level diagram of a microcontroller system 30 in accordance with one specific embodiment. Microcontroller system 30 includes both a microcontroller integrated circuit 31 with an on-chip temperature-compensated precision oscillator 32, as well as an external crystal oscillator 33. Internal temperature-compensated precision (ITCP) oscillator 32 is an RC oscillator without an external crystal and includes an RC circuit 34. Microcontroller integrated circuit 31 includes a clock controller 35 that determines whether external crystal oscillator 33 or ITCP oscillator 32 clocks a processor 36 of microcontroller integrated circuit 31. For some applications, despite variations in the operating temperature of microcontroller integrated circuit 31, ITCP oscillator 32 can generate a clock signal that is sufficiently stable and accurate to clock processor 36. For these applications, cost can be reduced by excluding external crystal oscillator 33 from microcontroller system 30.

External crystal oscillator 33 provides a high-speed external clock signal (ExtClk) to clock controller 35 via a terminal 37 on microcontroller integrated circuit 31. ITCP oscillator 32 outputs an internal clock signal (CLK) onto an internal clock output lead 38 and to an input lead 39 of clock controller 35. Clock controller 35 outputs either external clock signal (ExtClk) or internal clock signal (CLK) onto a system clock line 40 and to a system clock input lead 41 of processor 36. Clock controller 35 includes a programmable oscillator control register 42. Using an address decoder 43, processor 36 can both read from and write to register 42.

In the specific embodiment of FIG. 3, ITCP oscillator 32 can be disabled such that it does not oscillate and thereby consumes minimal power. If an enable signal ClkEn provided to clock enable lead 44 is deasserted, then ITCP oscillator 32 is disabled and is prevented from oscillating. If, on the other hand, the ClkEn signal asserted, then ITCP oscillator 32 is enabled and generates the internal clock signal (CLK) that is provided as the system clock to processor 36.

In one example of the operation of microcontroller system 30, ITCP oscillator 32 is initially disabled. When clock controller 35 detects that the external clock signal (ExtClk) output by external precision oscillator 33 is inadequate, then clock controller 35 enables ITCP oscillator 32 such that second precision oscillator generates the internal clock signal (CLK). Clock controller 35 switches the source of the system clock (SysClk) used to clock processor 36 from external crystal oscillator 33 to ITCP oscillator 32. Once the switch has been made, the internal clock signal (CLK) clocks processor 36. For additional details on a clock controller that automatically switching from a failed clock source to a new clock source, such as an internal precision oscillator, see U.S. patent application Ser. No. 10/764,391 entitled "Clock Controller with Clock Source Fail-Safe Logic," filed on Jan. 23, 2004, which is herein incorporated by reference.

FIG. 4 shows ITCP oscillator 32 in more detail. ITCP oscillator 32 includes a current controller 45, a master bias current source 46, an inverter circuit 47 and RC circuit 34. Current controller 45 has a control up bar lead 48, a control down lead 49, an inverter source output lead 50, an inverter sink output lead 51, a trigger voltage source lead 52, an output lead 53, a supply voltage lead 54, and an analog ground lead 55. RC circuit 34 includes a capacitor array 56, a resistor string 57 and a diode-connected n-channel field-effect transistor (FET) 58. In another embodiment, diode-connected transistor 58 is a bipolar transistor. Capacitor array 56 is coupled to a charge node 59 and to analog ground potential (AGND). Charge node 59 is also coupled to output lead 53 of current controller 45. Current controller 45 outputs a charge/discharge current 60 that alternately charges and discharged charge node 59. The frequency of internal clock signal (CLK) output onto internal clock output lead 38 corresponds to the rate at which charge on charge node 59 charges and discharges.

Inverter circuit 47 includes a lower trigger voltage comparator 61, an upper trigger voltage comparator 62, and an RS latch 63 for switching between comparators 61 and 62. In addition, inverter circuit 47 has an inverter input lead 65, a switching lead 66, an inverter current sink lead 67, and an inverter current source lead 68. Switching lead 66 is coupled to both control up bar lead 48 and control down lead 49 of current controller 45. Charge node 59 is coupled to inverter input lead 65, which in turn is coupled to both the non-inverting input lead of lower trigger voltage comparator 61 and the inverting input lead of upper trigger voltage comparator 62. Inverter current sink lead 67 of inverter circuit 47 is coupled to inverter sink output lead 51 of current controller 45. Current controller 45 draws an inverter sink current (ISNK) 69 into inverter sink output lead 51. Inverter current source lead 68 of inverter circuit 47 is coupled to inverter source output lead 50 of current controller 45. Current controller 45 outputs an inverter source current (ISRC) 70 onto inverter source output lead 50.

The voltage on charge node 59 decreases when charge/discharge current 60 discharges current from charge node 59. Because charge node 59 is coupled to the non-inverting input lead of lower trigger voltage comparator 61, lower trigger voltage comparator 61 outputs a digital low when the voltage on charge node 59 falls below a lower trigger voltage present on the inverting input lead of lower trigger voltage comparator 61. Upon receiving a digital low on a reset bar input lead (R_bar), RS latch 63 is reset, thereby outputting a digital low onto output lead Q and, in turn, onto switching lead 66 of inverter circuit 47. When a digital low is received on control up bar lead 48 of current controller 45, current controller 45 begins to source current onto charge node 59. The voltage on charge node 59 rises at a rate proportional to a time constant RC, where R is the resistance of resistor string 57 and C is the capacitance of capacitor array 56. The rate at which voltage on charge node 59 rises also depends on the magnitude of charge/discharge current 60.

When the voltage on charge node 59 rises above an upper trigger voltage present on the non-inverting input lead of upper trigger voltage comparator 62, upper trigger voltage comparator 62 outputs a digital low. Upon receiving a digital low on a set bar input lead (S_bar), RS latch 63 is set, thereby outputting a digital high onto output lead Q. When a digital high is received on control down lead 49 of current controller 45, current controller 45 draws current from charge node 59 until the voltage on charge node 59 next falls below the lower trigger voltage. The time that elapses from when the voltage on charge node 59 falls below the lower trigger voltage until that voltage next falls below the lower trigger voltage equals the period of a cycle of internal clock signal (CLK) output onto internal clock output lead 38 by ITCP oscillator 32.

In one embodiment, resistor string 57 is a series of four on-chip, p-channel diffusion resistors. Each resistor has a width of 5 microns. The four resistors have lengths of 95, 142.5, 285 and 500 microns, respectively. By incorporating the resistors on-chip, they can be manufactured with a less-costly MOS process, but therefore exhibit a positive temperature coefficient. The range between the upper and lower trigger voltages is set by the magnitude of a trigger voltage current (ITHRSD) 71 flowing through the resistance R of resistor string 57. Trigger voltage source lead 52 of current-controller 45 is coupled to resistor string 57, and current controller 45 outputs trigger voltage current (ITHRSD) 71 onto trigger voltage source lead 52. As the total resistance R of the four resistors increases with increasing temperature, the range between the upper and lower trigger voltages also increases. The frequency of internal clock signal (CLK) output by ITCP oscillator 32 would decrease as the resistance of resistor string 57 increases with increasing temperature if the magnitudes of trigger voltage current (ITHRSD) 71, inverter sink current (ISNK) 69 and inverter source current (ISRC) 70 were all held constant.

FIG. 5 is a simplified, idealized waveform diagram that illustrates how ITCP oscillator 32 compensates for changes in the resistance R of resistor string 57 caused by temperature variation in order to generate an internal clock signal (CLK) that is substantially independent of operating temperature. FIG. 5 shows a node voltage signal 72 present on charge node 59 at a first temperature. The time that elapses from a time $T_1$ at which the voltage of node voltage signal 72 falls below a lower trigger voltage 73 until a time $T_2$ at which the voltage of node voltage signal 72 next falls below lower trigger voltage 73 equals the period $P_1$ of one cycle of node voltage signal 72 at the first temperature. The period $P_1$ corresponds to the frequency of clock pulses output by ITCP oscillator 32 as internal clock signal (CLK).

The voltage on charge node 59 does not begin to rise immediately after the voltage of node voltage signal 72 falls below lower trigger voltage 73 at time $T_1$. Instead, there is a delay period $D_1$ before current controller 45 switches the direction of charge/discharge current 60 at $T_3$ to add charge to charge node 59. Delay period $D_1$ includes the time it takes after $T_1$ until lower trigger voltage comparator 61 outputs a digital low. A remainder period $RP_1$ occurs from time $T_3$ when current controller 45 begins to add charge to charge node 59 until a time $T_4$ when the voltage of node voltage signal 72 rises above an upper trigger voltage 74. In this example, the delay period $D_1$ plus the remainder period $RP_1$ is approximately a half cycle (C) of node voltage signal 72, which equals approximately half of the period $P_1$ of a cycle of internal clock signal (CLK).

An additional delay period $D_2$ occurs before current controller 45 switches the direction of charge/discharge current 60 at $T_5$ to discharge charge from charge node 59. Delay period $D_2$ includes the time it takes after $T_4$ until upper trigger voltage comparator 62 outputs a digital low. A remainder period $RP_2$ occurs from time $T_5$ when current controller 45 begins to discharge charge from charge node 59 until time $T_2$ when the voltage of node voltage signal 72 again falls below lower trigger voltage 73. ITCP oscillator 32 is designed such that delay period $D_1$ of lower trigger voltage comparator 61 and delay period $D_2$ of upper trigger voltage comparator 62 are substantially identical at any given temperature. By manufacturing comparators 61 and 62 with the same semiconductor process on the same chip, delay period $D_1$ can be made to track delay period $D_2$.

FIG. 5 also shows a node voltage signal 77 (shown as a dashed triangular wave) at a second temperature that is higher than the first temperature. Because resistor string 57 has a positive temperature coefficient, its resistance R is larger at the second temperature. In this example, the larger resistance R increases both the lower and the upper trigger voltages received by comparators 61 and 62, respectively. The upper trigger voltage, however, increases by a larger absolute amount than does the lower trigger voltage. In the example of FIG. 5, the lower trigger voltage 73 of 0.75V increases to an increased lower trigger voltage 75 of about 0.85V. The upper trigger voltage 74 of 1.75V increases even more to an increased upper trigger voltage 76 of about 2.1V. Thus, a range 78 between lower and upper trigger voltages is 1V at the temperature of node voltage signal 72, whereas a range 79 between trigger voltages is about 1.25V at the higher temperature of node voltage signal 77.

Despite the different ranges between trigger voltages, however, ITCP oscillator 32 generates internal clock signal (CLK) with a period that is substantially independent of the temperature induced changes to the trigger voltages. As will be described below, ITCP oscillator 32 adjusts charge/discharge current 60 to compensate for the temperature induced changes to the RC time constant so that charge node 59 charges and discharges at the same rate over the entire range of operating temperatures of ITCP oscillator 32. Therefore, charge/discharge current 60 charges and discharges charge node 59 at the same rate at both the temperatures of node voltage signal 72 and node voltage signal 77, i.e., the slopes of signals 72 and 77 are the same.

As the range between trigger voltages increases, it takes longer for the charge on charge node 59 to charge and discharge to the next trigger voltage, and the remainder period RP increases. Node voltage signal 77 requires a longer remainder period $RP_3$ to charge up to increased upper trigger voltage 76 than the remainder period $RP_1$ taken by node voltage signal 72 to charge up to upper trigger voltage 74. To compensate for the increased remainder period, ITCP oscillator 32 shortens the delay period before current controller 45 switches the direction of charge/discharge current 60 to add charge to charge node 59. Because the delay period includes the time it takes after crossing the lower trigger voltage until lower trigger voltage comparator 61 outputs a digital low, ITCP oscillator 32 can shorten the delay period by shortening the response time of lower trigger voltage comparator 61. Current controller 45 adjusts inverter sink current (ISNK) 69 to shorten the response time of lower trigger voltage comparator 61, thereby reducing the delay period to a shortened delay period $D_3$. ITCP oscillator 32 thereby adjusts the delay period such that the sum of the delay period plus the following remainder period remains substantially constant at the temperature of node voltage signal 72 and at the higher temperature of a node voltage signal 77. At both temperatures, the sum of the delay period and the remainder period is half cycle (C). FIG. 5 shows that at both temperatures $D_1+RP_1=D_3+RP_3=C$.

In a similar fashion, current controller 45 adjusts inverter source current (ISRC) 70 to shorten the response time of upper trigger voltage comparator 62, thereby reducing the delay period to a shortened delay period $D_4$ at the higher temperature of a node voltage signal 77. ITCP oscillator 32 thereby adjusts the delay period such that the sum of the delay period plus the following remainder period is substantially constant at the temperature of node voltage signal 72 and at the higher temperature of a node voltage signal 77. At both temperatures, ITCP oscillator 32 adjusts the delay period such that the sum of the second delay period and the second remainder period remains constant. FIG. 5 also shows that at both temperatures $D_2+RP_2=D_4+RP_4$. Because $D_1+RP_1+D_2+RP_2=D_3+RP_3+D_4+RP_4=P_1$, the period $P_1$ of a cycle of internal clock signal (CLK) output by ITCP oscillator 32 remains constant over the entire range of operating temperatures of ITCP oscillator 32.

Figure 6:
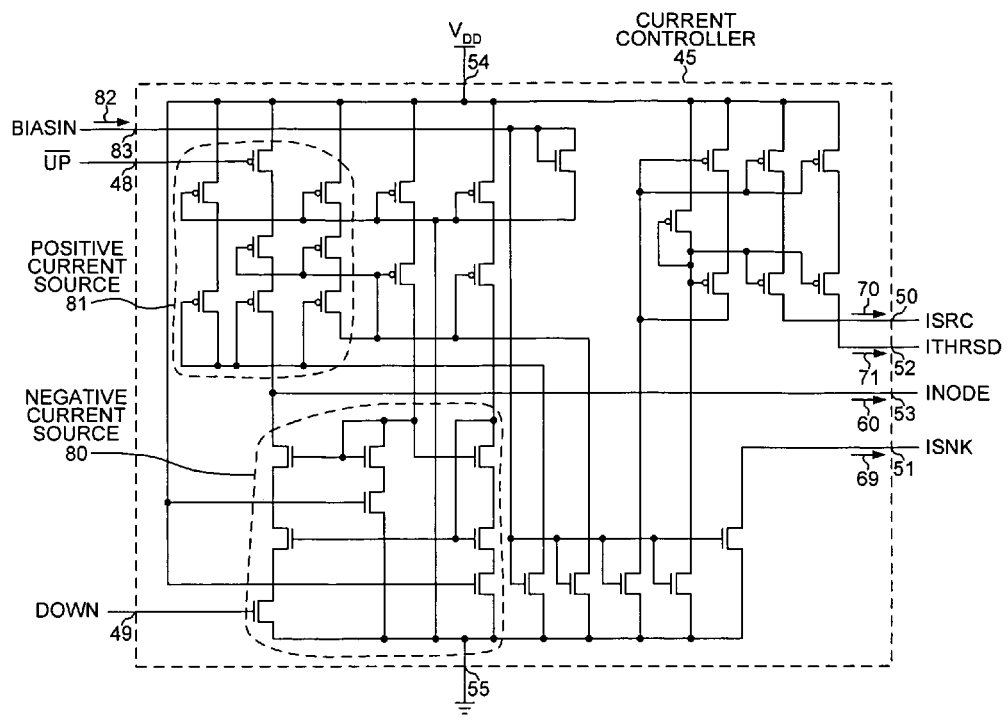
FIG. 6 is a more detailed schematic diagram of the components of a current controller of the internal temperature-compensated precision oscillator of FIG. 3.

FIG. 6 shows current controller 45 in more detail. Current controller 45 receives the output of inverter circuit 47 on control up bar lead 48 and control down lead 49. When a digital high is received on control down lead 49, a negative current source 80 turns on and causes charge/discharge current 60 to draw current from charge node 59. When a digital low is received on control up bar lead 48, a positive current source 81 causes charge/discharge current 60 to supply current onto charge node 59. Current controller 45 also receives a master bias current 82 on a BIASIN lead 83 from master bias current source 46. Based on master bias current 82 and the output of inverter circuit 47, current controller 45 outputs four current signals: charge/discharge current 60, inverter sink current (ISNK) 69, inverter source current (ISRC) 70, and trigger voltage current (ITHRSD) 71. These four current signals vary with temperature and scale together.

Current controller 45 and master bias current source 46 together adjust charge/discharge current 60 to compensate for the temperature induced changes to the RC time constant so that charge/discharge current 60 charges and discharges charge node 59 at the same rate over the entire range of operating temperatures of ITCP oscillator 32. For example, where the RC time constant increases with increasing temperature, an increasing amount of current flows through positive current source 81 and increases the magnitude of charge/discharge current 60.

Figure 7:
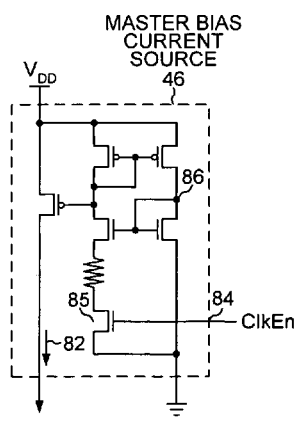
FIG. 7 is a more detailed schematic diagram of the components of a master bias current source of the internal temperature-compensated precision oscillator of FIG. 3.

FIG. 7 shows master bias current source 46 in more detail. Master bias current source 46 is a Widlar current source modified for a CMOS manufacturing process. Master bias current source 46 is a positive-to-absolute-temperature (PTAT) current source and exhibits a positive temperature coefficient. Master bias current source 46 generates master bias current 82. An enable input lead 84 of master bias current source 46 is coupled to clock enable lead 44 of ITCP oscillator 32. When the enable signal ClkEn that is received on enable input lead 84 is asserted, the drain of a transistor 85 is pulled to ground, and master bias current source 46 outputs master bias current 82. On the other hand, when the enable signal ClkEn is deasserted, master bias current source 46 provides no master bias current 82 to current controller 45, an no charge/discharge current 60 is produced. Consequently, ITCP oscillator 32 is disabled and no internal clock signal (CLK) is generated.

In an alternative embodiment, a startup circuit is coupled to a node 86 of master bias current source 46. The startup time of ITCP oscillator 32 speeds up to about a few milliseconds with the startup circuit, as opposed to a startup time of about a few microseconds without the startup circuit.

Figure 8:
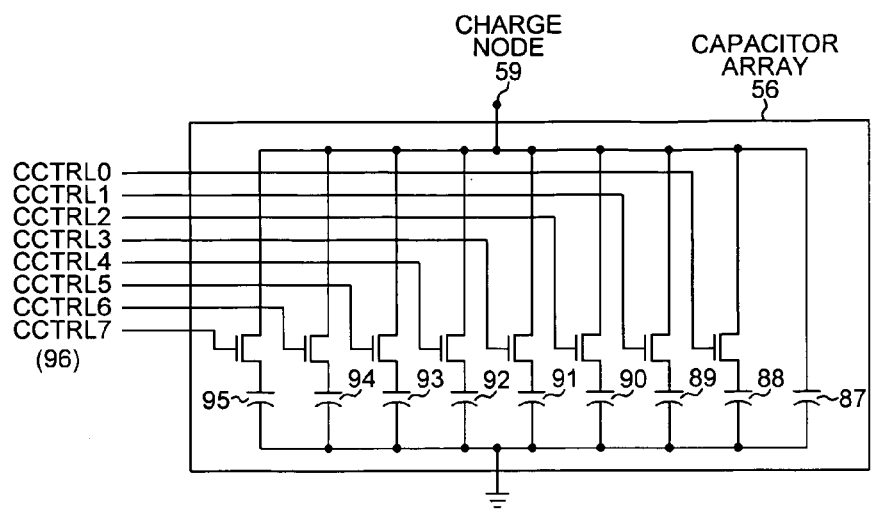
FIG. 8 is a more detailed schematic diagram of the components of a capacitor array of the internal temperature-compensated precision oscillator of FIG. 3.

FIG. 8 is a schematic circuit diagram showing one embodiment of capacitor array 56. In this embodiment, capacitor array 56 includes nine polysilicon-metal sandwich capacitors 87–95. Capacitor 87 is coupled directly to charge node 59. Eight capacitors 88–95 are coupled to charge node 59 through switches. In this embodiment, each of the switches is an n-channel field effect transistor. Individual switches are turned on by asserting individual bits of an 8-bit capacitor control signal (CCTRL) 96. By coupling various capacitors to charge node 59, the capacitance that determines the RC time constant can be controlled and the frequency of the internal clock signal (CLK) can be set.

Figure 9:
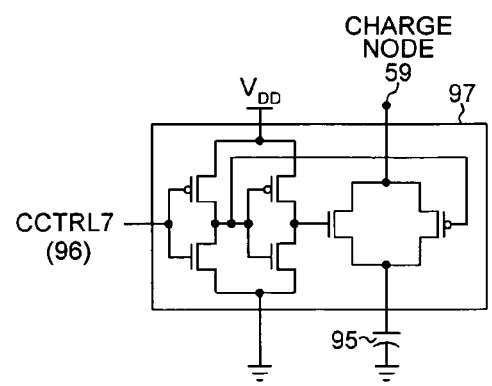
FIG. 9 is a schematic diagram of an alternative embodiment of a component of the capacitor array of FIG. 8.

FIG. 9 is a schematic circuit diagram of another embodiment of the switches of FIG. 8. FIG. 9 shows a switch 97 that receives the eighth bit (CCTRL7) of capacitor control signal (CCTRL) 96. Capacitor 95 is coupled to charge node 59 through switch 97.

Figure 10:
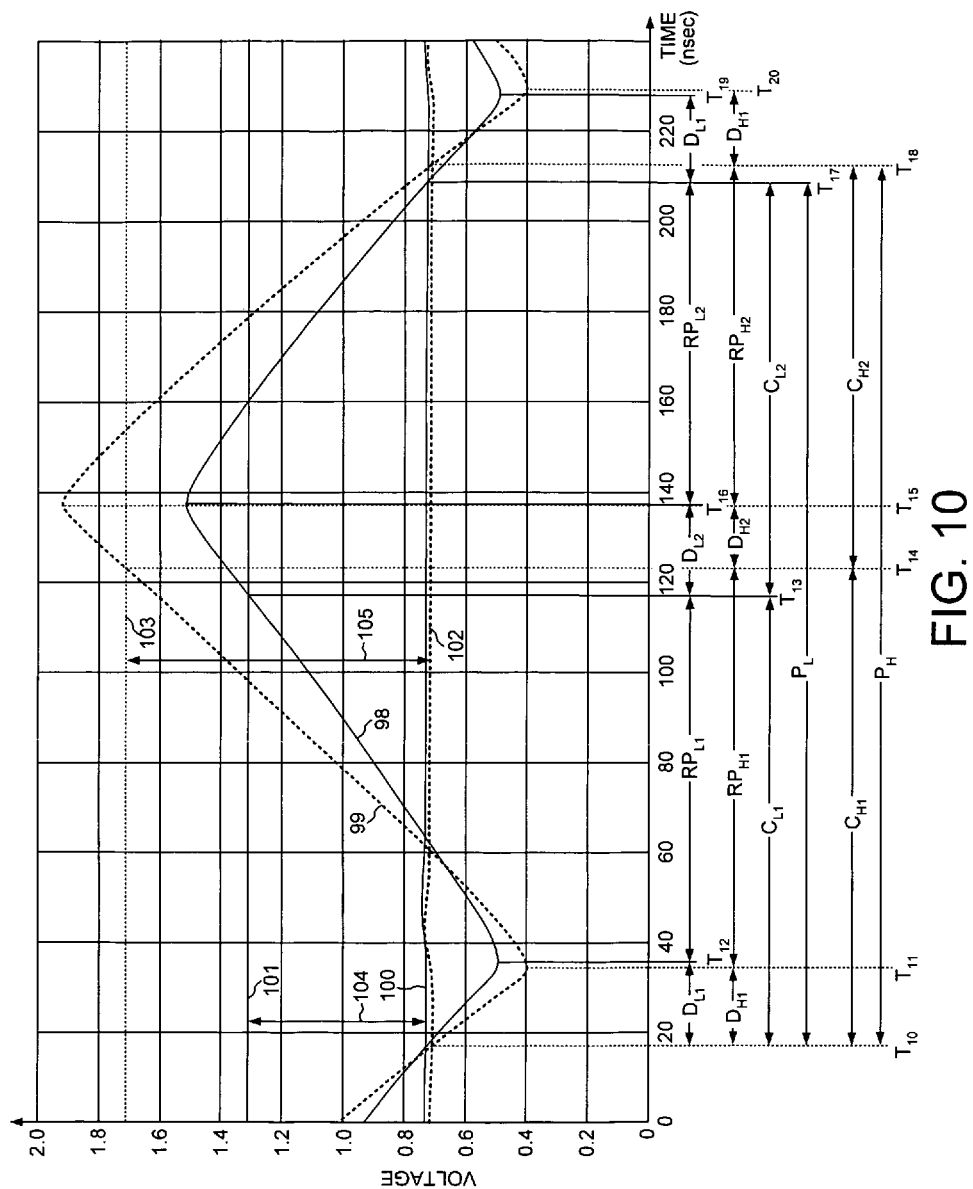
FIG. 10 is diagram of two voltage waveforms on a charge node of the internal temperature-compensated precision oscillator at two temperatures.

FIG. 10 is a waveform diagram illustrating the operation of one specific embodiment of ITCP oscillator 32 at a lower temperature (−40° C.) and at a higher temperature (+105° C.). FIG. 10 shows a node voltage signal 98 (shown as a solid curve) present on charge node 59 at the lower temperature and a node voltage signal 99 (shown as a dashed curve) present on charge node 59 at the higher temperature. The time that elapses from a time $T_{10}$ at which the voltage of node voltage signal 98 falls below a lower trigger voltage 100 until a time $T_{17}$ at which the voltage of node voltage signal 98 next falls below lower trigger voltage 100 equals the period $P_L$ of one cycle of node voltage signal 98 at the lower temperature. The period $P_L$ of one cycle of node voltage signal 98 is about 190 nanoseconds at the lower temperature. The period $P_L$ corresponds to the frequency of clock pulses output by ITCP oscillator 32 as internal clock signal (CLK).

A delay period $D_{L1}$ occurs after the voltage of node voltage signal 98 falls below lower trigger voltage 100 at time $T_{10}$ and before current controller 45 switches the direction of charge/discharge current 60 at $T_{12}$ to add charge to charge node 59. A remainder period $RP_{L1}$ occurs from time $T_{12}$ when current controller 45 begins to add charge to charge node 59 until a time $T_{13}$ when the voltage of node voltage signal 98 rises above an upper trigger voltage 101. The delay period $D_{L1}$ plus the remainder period $RP_{L1}$ makes up a cycle portion ($C_{L1}$) of node voltage signal 98. In this embodiment, cycle portion ($C_{L1}$) is more than half of the period $P_L$ of a cycle of internal clock signal (CLK) in part because charge/discharge current 60 discharges charge node 59 at a faster rate than charge/discharge current 60 charges charge node 59.

An additional delay period $D_{L2}$ occurs before current controller 45 switches the direction of charge/discharge current 60 at $T_{16}$ to discharge charge from charge node 59. Delay period $D_{L2}$ includes the time it takes after $T_{13}$ until upper trigger voltage comparator 62 outputs a digital low. A remainder period $RP_{L2}$ occurs from time $T_{16}$ when current controller 45 begins to discharge charge from charge node 59 until time $T_{17}$ when the voltage of node voltage signal 98 again falls below lower trigger voltage 100. The resistance R of resistor string 57 is higher at the higher temperature than at the lower temperature because resistor string 57 has a positive temperature coefficient. In this embodiment, the larger resistance R decreases the lower trigger voltage slightly and increases the upper trigger voltage substantially. FIG. 10 shows the lower trigger voltage 100 of about 0.74V decreasing to decreased lower trigger voltage 102 of about 0.72V. The upper trigger voltage 101 of about 1.31V increases to an increased upper trigger voltage 103 of about 1.71V. Thus, a range 104 between lower and upper trigger voltages is about 0.57V at the lower temperature, whereas a range 105 between trigger voltages is about 0.99V at the higher temperature.

ITCP oscillator 32 compensates for changes in the resistance R of resistor string 57 caused by the change from the lower temperature to the higher temperature such that internal clock signal (CLK) that is substantially independent of operating temperature. Despite the different ranges between trigger voltages, internal clock signal (CLK) has a frequency corresponding to period $P_L$ at the lower temperature and to a period $P_H$ at the higher temperature, where period $P_H$ is minimally longer than $P_L$, as shown in FIG. 10.

In this embodiment, ITCP oscillator 32 adjusts inverter sink current (ISNK) 69, inverter source current (ISRC) 70, as well as charge/discharge current 60 to compensate for the temperature induced changes to the RC time constant. ITCP oscillator 32 increases charge/discharge current 60 as temperature increases so that charge node 59 charges and discharges faster as the range between trigger voltages increases with increasing temperature. FIG. 10 shows that charge/discharge current 60 charges and discharges charge node 59 faster at the higher temperature because the slope of node voltage signal 99 (dashed curve) at +105° C. is steeper than the slope of node voltage signal 98 (solid curve) at −40° C. The faster charging and discharging of charge node 59, however, does not entirely compensate for the larger range between trigger voltages at the higher temperature. FIG. 10 shows that, despite the steeper slope of node voltage signal 99, a remainder period $RP_{H1}$ at the higher temperature is nevertheless longer than the remainder period $RP_{L1}$ at the lower temperature.

ITCP oscillator 32 compensates for this discrepancy in remainder periods by decreasing the delay period $D_{H1}$ at the higher temperature relative to the delay period $D_{L1}$ at the lower temperature. The delay period $D_{H1}$ includes the response time of lower trigger voltage comparator 61. The delay period is shortened when current controller 45 adjusts inverter sink current (ISNK) 69 to shorten the response time of lower trigger voltage comparator 61. In a similar fashion, current controller 45 adjusts inverter source current (ISRC) 70 to shorten the response time of upper trigger voltage comparator 62, thereby reducing the delay period $D_{L2}$ to a shortened delay period $D_{H2}$ at the higher temperature.

ITCP oscillator 32 thereby adjusts the delay periods such that the sum of the delay periods plus the remainder periods remains substantially constant at the lower temperature and at the higher temperature. At both temperatures, ITCP oscillator 32 adjusts inverter sink current (ISNK) 69, inverter source current (ISRC) 70, and charge/discharge current 60 such that $D_{L1}+RP_{L1}+D_{L2}+RP_{L2}=P_L \approx P_H=D_{H1}+RP_{H1}+D_{H2}+RP_{H2}$ The period $P_H$ of one cycle of node voltage signal 99 is about 195 nanoseconds at the higher temperature. Thus, the period of a cycle of node voltage signal 99 at the higher temperature (+105° C.) is only about 2.6% longer than the period of a cycle of node voltage signal 98 at the lower temperature (−40° C.), despite the 145° C. temperature difference. The period of a cycle of internal clock signal (CLK) output by ITCP oscillator 32 remains substantially constant over the entire range of operating temperatures of ITCP oscillator 32.

Figure 11:
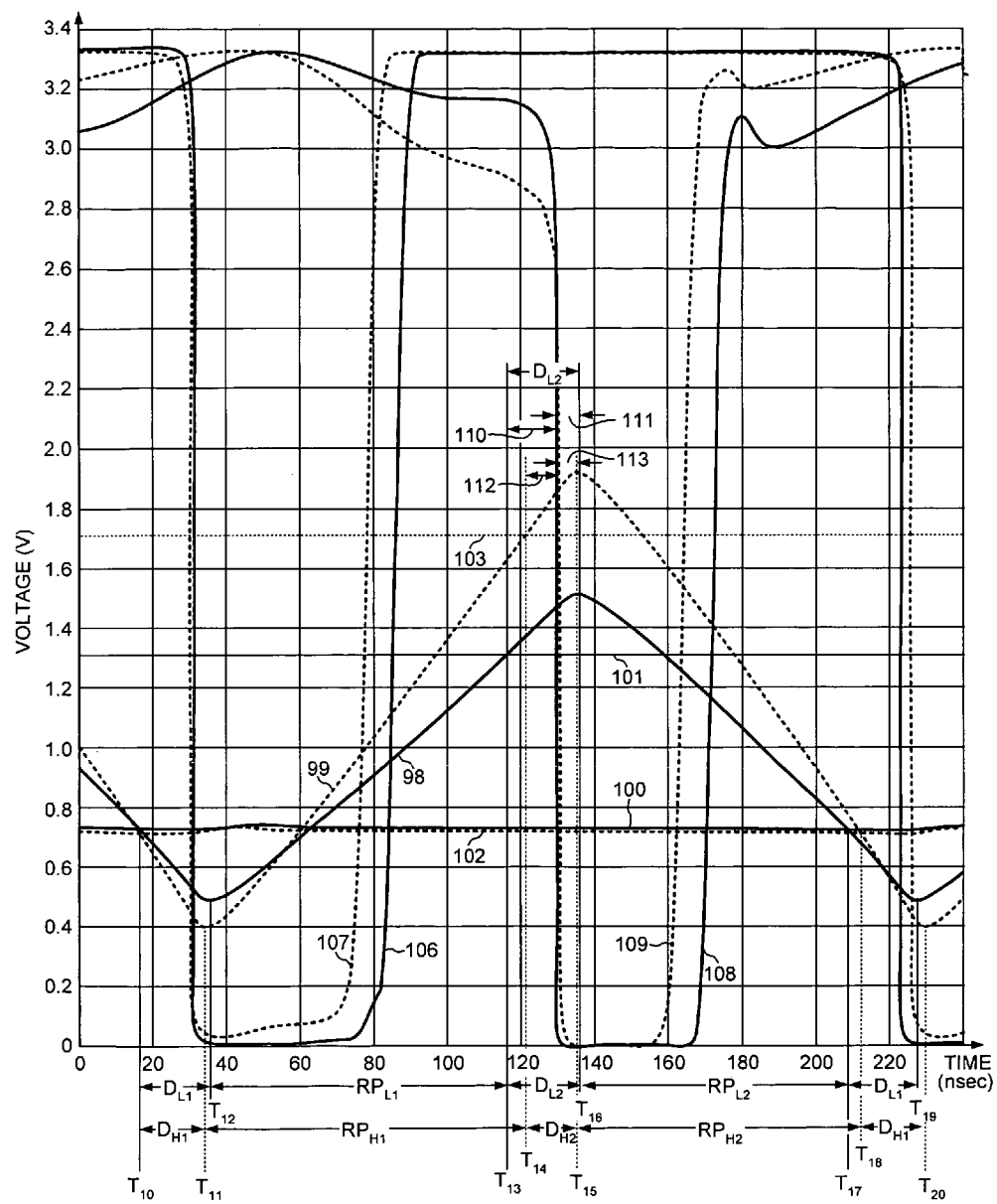
FIG. 11 is a waveform diagram illustrating the operation of the internal temperature-compensated precision oscillator at the two temperatures.

FIG. 11 is a diagram showing voltage waveforms in addition to node voltage signals 98 and 99 that illustrate the operation of ITCP oscillator 32 at the lower temperature and at the higher temperature. FIG. 11 shows the voltage waveforms output by lower trigger voltage comparator 61 and upper trigger voltage comparator 62. Lower trigger voltage comparator 61 outputs waveform 106 (solid) at the lower temperature (−40° C.) and waveform 107 (dashed) at the higher temperature (+105° C.). Upper trigger voltage comparator 62 outputs waveform 108 (solid) at the lower temperature (−40° C.) and waveform 109 (dashed) at the higher temperature (+105° C.).

FIG. 11 illustrates the contribution of the response time of the comparators to the overall delay periods. The delay periods include the time it takes after crossing a trigger voltage until comparator 61 or comparator 62 switches its digital output. For example, delay period $D_{L2}$ at the lower temperature includes a response time 110 after $T_{13}$ until upper trigger voltage comparator 62 outputs a digital low. The time at which upper trigger voltage comparator 62 is shown in FIG. 11 to have output a digital low corresponds to the point at which waveform 108 is approximately half way between its maximum voltage of about 3.3V and its minimum voltage of about zero volts. In addition to response time 110 of upper trigger voltage comparator 62, delay period $D_{L2}$ also includes a delay 111 attributable to RS latch 63 and current controller 45.

At the higher temperature, delay period $D_{H2}$ includes a response time 112 after $T_{14}$ until upper trigger voltage comparator 62 outputs a digital low. Upper trigger voltage comparator 62 is shown in FIG. 11 to output a digital low at the point at which waveform 109 (dashed) is approximately half way between its maximum voltage and minimum voltage. Delay period $D_{H2}$ includes a delay 113 attributable to RS latch 63 and current controller 45 at the higher temperature. FIG. 11 illustrates that ITCP oscillator 32 produces a shorter response time 112 at the higher temperature and a longer response time 110 at the lower temperature. The shorter response time 112 at the higher temperature significantly compensates for the longer remainder period $RP_{H1}$ at the higher temperature that results from the larger range between trigger voltages at the higher temperature.

Figure 12:
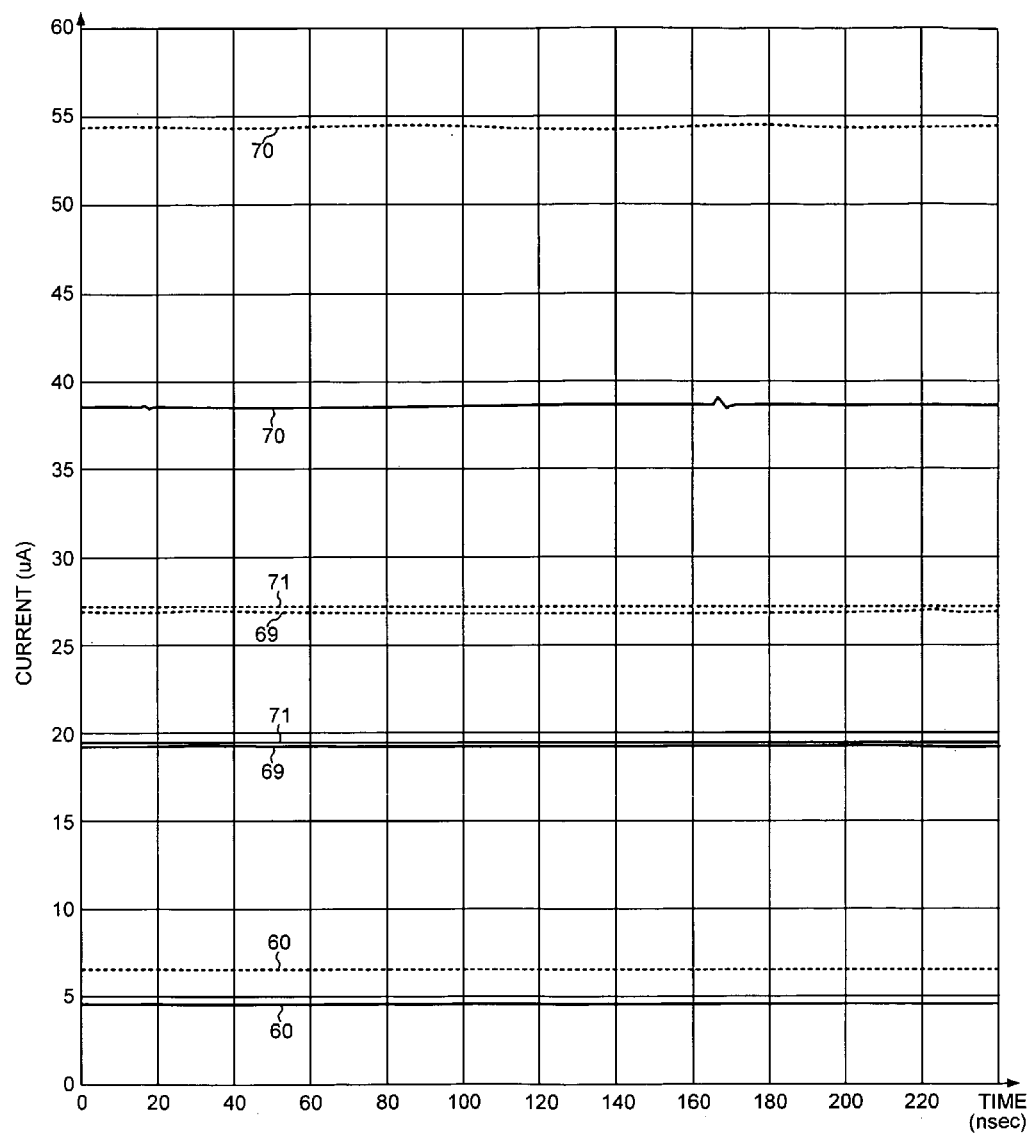
FIG. 12 is a diagram of current waveforms illustrating the operation of the internal temperature-compensated precision oscillator at the two temperatures.

FIG. 12 shows current waveforms that illustrate the operation of ITCP oscillator 32 at the lower temperature and at the higher temperature. Current waveforms at both temperatures are shown for charge/discharge current 60, inverter sink current (ISNK) 69, inverter source current (ISRC) 70 and trigger voltage current (ITHRSD) 71. These current waveforms are output by current controller 45 during the period of the 200-nanosecond cycles of node voltage signals 98 and 99 shown in FIGS. 10 and 11. The current waveforms are shown as solid curves at the lower temperature (−40° C.) and as dashed curves at the higher temperature (+105° C.). FIG. 12 shows that the magnitude of inverter sink current (ISNK) 69 and inverter source current (ISRC) 70 increases with increasing temperature, which enables ITCP oscillator 32 to decrease comparator response times as temperature increases.

Although the present invention has been described in connection with certain specific embodiments for instructional purposes, the present invention is not limited thereto. In one specific embodiment described above, the ITCP oscillator 32 compensates for the increasing range between trigger voltages as temperature increases by decreasing comparator response times and by increasing the rate at which the charge node charges and discharges. In other embodiments, ITCP oscillator 32 compensates only by decreasing comparator response times or only by increasing the rate at which the charge node charges and discharges. Although ITCP oscillator 32 is described as fully integrated with and embedded within a microcontroller integrated circuit, and ITCP oscillator can be realized in stand-alone applications and can involve external components. Accordingly, various modifications, adaptations, and combinations of various features of the described embodiments can be practiced without departing from the scope of the invention as set forth in the claims.

What is claimed is:

1. A method comprising:
   (a) detecting when a node voltage reaches a first trigger voltage, wherein the node voltage reaches the first trigger voltage at a start time, wherein a delay period begins at the start time and ends at an end time, and wherein the delay period is dependent on an inverter source current;
   (b) inverting a digital signal at the end time;
   (c) detecting when the node voltage reaches a second trigger voltage, wherein a remainder period begins at the end time and ends when the node voltage reaches the second trigger voltage, and wherein the second trigger voltage is a first voltage at a first temperature and a second voltage at a second temperature; and
   (d) generating the inverter source current such that the sum of the delay period plus the remainder period remains substantially constant at the first temperature and at the second temperature.

2. The method of claim 1, wherein the delay period decreases as the inverter source current increases.

3. The method of claim 1, wherein the node voltage oscillates at a frequency at which the digital signal is inverted in (b).

4. The method of claim 1, wherein a comparator detects when the node voltage reaches the first trigger voltage in (a).

5. The method of claim 4, wherein a second comparator detects when the node voltage reaches the second trigger voltage in (c).

6. The method of claim 1, further comprising:
   (e) increasing the node voltage upon inverting the digital signal in (b).

7. The method of claim 1, further comprising:
   (e) generating an oscillating output signal using the digital signal.

8. The method of claim 1, wherein the node voltage is present on a node of a capacitor having a capacitance, and wherein the remainder period depends on the capacitance.

9. The method of claim 1, wherein the node voltage is present on a node of a capacitor having a capacitance, further comprising:
   (e) supplying a node current onto the node, wherein the remainder period depends on the node current and on the capacitance.

10. The method of claim 1, wherein (a), (b), (c) and (d) are performed on a single integrated circuit die.

11. A device comprising:
   a capacitor coupled to a charge node, wherein a node voltage is present on the charge node;
   a current controller with a control lead, an inverter source output lead and a trigger voltage source lead, wherein the current controller outputs an inverter source current onto the inverter source output lead; and
   an inverter circuit with an inverter input lead, an inverter current source lead and a switching lead, wherein the inverter input lead is coupled to the charge node, the inverter current source lead is coupled to the inverter source output lead, and the switching lead is coupled to the control lead, wherein the inverter circuit outputs onto the switching lead a digital signal that inverts at an end time, wherein the node voltage reaches a first trigger voltage at a start time, wherein a delay period begins at the start time and ends at the end time, wherein a remainder period begins at the end time and ends when the node voltage reaches a second trigger voltage, wherein the second trigger voltage is a first voltage at a first temperature and a second voltage at a second temperature, wherein the delay period is dependent on the inverter source current, and wherein the sum of the delay period plus the remainder period remains substantially constant at the first temperature and at the second temperature.

12. The device of claim 11, wherein the device is an RC oscillator that is fully integrated onto an integrated circuit.

13. The device of claim 11, wherein the trigger voltage source lead is coupled to a resistor that exhibits a first resistance at the first temperature and a second resistance at the second temperature.

14. The device of claim 11, wherein the capacitor has a capacitance that is controllable.

15. The device of claim 11, wherein the inverter circuit comprises a comparator.

16. The device of claim 11, wherein the node voltage is outside a voltage range bounded by the first trigger voltage and the second trigger voltage for approximately twice the delay period.

17. The device of claim 11, wherein the current controller has an inverter sink output lead, wherein the inverter circuit has an inverter current sink lead, and wherein the inverter current sink lead is coupled to the inverter sink output lead.

18. A system comprising:
  a node, wherein a node voltage is present on the node;
  means for inverting a digital signal at an end time, wherein the node voltage reaches a first trigger voltage at a start time, wherein a delay period begins at the start time and ends at the end time, wherein a remainder period begins at the end time and ends when the node voltage reaches a second trigger voltage, wherein the second trigger voltage is a first voltage at a first temperature and a second voltage at a second temperature; and
  means for adjusting the delay period such that the sum of the delay period plus the remainder period remains substantially constant at the first temperature and at the second temperature.

19. The system of claim 18, wherein the means for inverting comprises a comparator.

20. The system of claim 18, wherein the means for adjusting generates a source current that is received by the means for inverting.

* * * * *